United States Patent
Lai

(10) Patent No.: US 10,797,672 B2
(45) Date of Patent: Oct. 6, 2020

(54) SIGNAL CHANNEL EXPANDING SYSTEM BASED ON PAD

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xueqian Lai, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 283 days.

(21) Appl. No.: 15/975,213

(22) Filed: May 9, 2018

(65) Prior Publication Data
US 2019/0207578 A1 Jul. 4, 2019

Related U.S. Application Data

(63) Continuation of application No. PCT/CN2018/073466, filed on Jan. 19, 2018.

(30) Foreign Application Priority Data

Dec. 28, 2017 (CN) .......................... 2017 1 1462542

(51) Int. Cl.
*H03G 9/02* (2006.01)
*G01R 31/28* (2006.01)
*G06F 11/22* (2006.01)

(52) U.S. Cl.
CPC .......... *H03G 9/025* (2013.01); *G01R 31/2801* (2013.01); *G01R 31/2808* (2013.01); *G01R 31/2884* (2013.01); *G06F 11/22* (2013.01)

(58) Field of Classification Search
None
See application file for complete search history.

(56) References Cited

U.S. PATENT DOCUMENTS

| | | | |
|---|---|---|---|
| 5,877,942 A * | 3/1999 | Kida | ........................ H05K 1/029 361/679.01 |
| 7,429,724 B1 | 9/2008 | Meisel et al. | |

(Continued)

FOREIGN PATENT DOCUMENTS

| | | |
|---|---|---|
| CN | 101471321 | 7/2009 |
| CN | 101533820 | 9/2009 |

(Continued)

*Primary Examiner* — Jas A Sanghera
(74) *Attorney, Agent, or Firm* — Hemisphere Law, PLLC; Zhigang Ma

(57) ABSTRACT

A signal channel expanding system based on PAD is provided, including a motherboard disposed on an array tester and a plurality of array test pads disposed on a periphery of the motherboard and configured to control the motherboard; each of the array test pads includes a plurality of pins, each of the pins corresponds to a signal channel, the array test pads include at least two left driving array test pads and at least two right driving array test pads. Compared with the related art, in the signal channel expanding system based on PAD in the disclosure, by using at least two left driving array test pads and at least two right driving array test pads on the periphery of the motherboard, the number of the pins on the periphery of the motherboard can be multiplied and the pin size can remain unchanged without lengthening the test jig.

12 Claims, 2 Drawing Sheets

(56) References Cited

U.S. PATENT DOCUMENTS

2014/0078026 A1* 3/2014 Du .................. G09G 3/006
                                                                    345/55
2015/0268271 A1    9/2015 Lo et al.

FOREIGN PATENT DOCUMENTS

| CN | 101996991 A | 3/2011 |
| CN | 102645625   | 8/2012 |
| CN | 102879926 A | 1/2013 |
| CN | 107123384   | 9/2017 |

* cited by examiner

SIGNAL CHANNEL EXPANDING SYSTEM BASED ON PAD

RELATED APPLICATIONS

This application is a continuation application of PCT Patent Application No. PCT/CN2018/073466, filed Jan. 19, 2018, which claims the priority benefit of Chinese Patent Application No. 201711462542.0, filed Dec. 28, 2017, which is herein incorporated by reference in its entirety.

FIELD OF THE DISCLOSURE

The disclosure relates to the field of liquid crystal display technology, and in particular to a signal channel expanding system based on PAD.

BACKGROUND

To meet the increased signal channel requirements of 4K/8K and other high-resolution products, the signal channels of the original array tester is doubled.

However, the conventional method of expanding signal channel is to increase the number of PADs on a single set of the automatic transfer switch (ATS) PAD, this method has the following disadvantages: 1. Fewer PADs can be increased; 2. Increasing the number of PADs in a set of ATS PAD will cause the PAD size to become smaller, resulting in the test pad contact will be partial; 3. Increasing the PAD in the same set too much will lead to the test jig contact become longer, the failure frequency of test pad contact also increases.

Therefore, it is necessary to provide a new signal channel expanding system based on PAD to solve the problems.

SUMMARY

A technical problem to be solved by the disclosure is to provide a signal channel expanding system based on PAD. By adding an extra set of the PAD, the number of PADs can be multiplied, the PAD size remains unchanged, and the test jig does not need to be longer.

To solve the above technical problem, the disclosure provides a signal channel expanding system based on PAD, including a motherboard disposed on an array tester and a plurality of array test pads disposed on a periphery of the motherboard and configured to control the motherboard. Each of the array test pads includes a plurality of pins, and each of the pins corresponds to a signal channel. The array test pads include at least two left driving array test pads and at least two right driving array test pads.

Optionally, each of the array test pads includes 23 of the pins.

Optionally, a length of each of the pins is 3.7 mm, a width thereof is greater than or equal to 2.5 mm, a spacing between the pins adjacent to each other is 1 mm, and a total length of each of the array test pads is 107.1 mm.

Optionally, the numbers of the left driving array test pads and the right driving array test pads are the same and both are even numbers.

Optionally, both the numbers of the left driving array test pads and the right driving array test pads are two.

Optionally, two of the left driving array test pads are disposed on a side of the motherboard, and two of the right driving array test pads are disposed on another side of the motherboard.

Optionally, the left driving array test pads and the right driving array test pads are respectively disposed on two opposite sides of the motherboard.

Compared with the related art, in the signal channel expanding system based on PAD provided by the disclosure, by using at least two left driving array test pads and at least two right driving array test pads on the periphery of the motherboard, the number of the pins on the periphery of the motherboard can be multiplied, the pin size remains unchanged and the test jig do not need to be lengthened.

DETAILED DESCRIPTION OF PREFERRED EMBODIMENTS

The technical solutions in the embodiments of the disclosure will be described clearly and completely below. Obviously, the described embodiments are only a part but not all embodiments of the disclosure. In view of the embodiments described herein, any other embodiment obtained by those of ordinary skill in the art skilled in this art without offering creative effort is included in a scope claimed by the disclosure.

Figure 1:
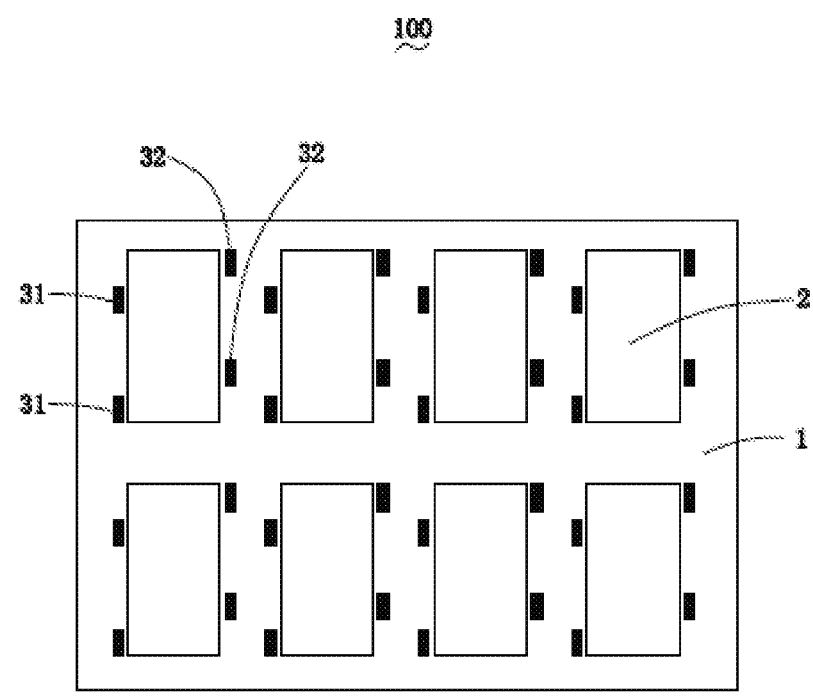
FIG. 1 is a schematic structural diagram of a signal channel expanding system based on PAD according to an embodiment of the disclosure.

Referring to FIG. 1, a signal channel expanding system based on PAD 100 provided by the disclosure includes motherboards 2 disposed on an array tester 1 and a plurality of array test pads 3 disposed on a periphery of the motherboard 2 and configured to control the motherboards 2. A plurality of the motherboards 2 are uniformly arrayed on the array tester 1, and a plurality of the motherboards 2 are spaced apart from each other. In the specific embodiment provided by the disclosure, the length of the array tester 1 is 3370 mm and the width of the array tester is 2940 mm. The array tester 1 is provided with 8 of the motherboards 2.

The size of each of the motherboards 2 is different, and the number of the array test pads 3 provided on the periphery of the motherboards may be the same or different. For example, the 43 inches of the motherboard 2 is arranged with 8 sets of the array test pads 3; the 65 inches of the motherboard 2 is arranged with 4 sets of the array test pads 3; the 75 inches of the motherboard 2 is arranged with 4 sets of the array test pads 3.

Figure 2:
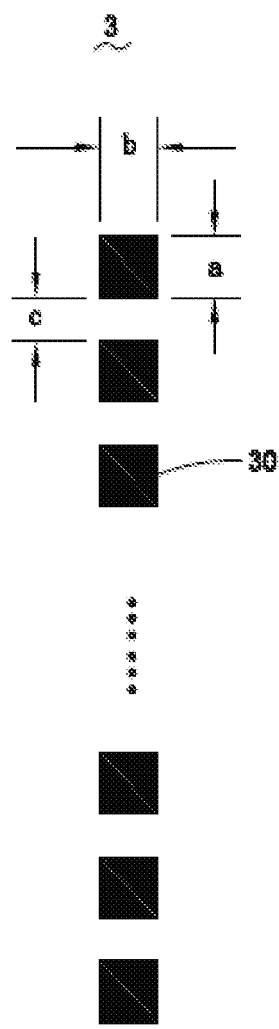
FIG. 2 is a schematic structural diagram of an array test pad in a signal channel expanding system based on PAD according to an embodiment of the disclosure.

Referring to FIG. 2, the array test pad 3 includes a plurality of pins 30, each of the pins 30 corresponds to a signal channel, the array test pad 3 includes at least two left driving test pads 31 and at least two right driving test pads 32. In this way, the number of the pins 30 is greatly increased by adding a plurality of the array test pads 3 without adding the motherboards 2. Since each of the pins 30 corresponds to a signal channel, the number of the signal channels increases correspondingly with the increase of the pins 30. That is to say, 23 of the signal channels may be added with each array test pad 3 increasing, and each of the signal channels may be independently controlled and given a different waveform under software support.

In addition, in the disclosure, the signal channels are increased by adding the array test pads 3 on two sides of the motherboard, which may result in the need of more test jigs, but the structure of the test jig do not need to be changed.

Compared with the traditional method of simply increasing the number of pins in a single array test pad, the design cost of the test jig is saved. Moreover, the signal channel expanding system 100 based on PAD provided by the disclosure can double the number of the pins 30 without changing the structure of the test jig, and the size of the pins 30 remains unchanged. It can be seen from the above that the disclosure provides a brand-new way of thinking to expand the signal path and overcome the design bias of the traditional thinking, not only achieving unexpected results, but also satisfying various design requirements.

The number of the left driving array test pads 31 and the number of the right driving array test pads 32 are the same and both are even numbers. In the specific embodiment provided by the disclosure, the left driving array test pads 31 and the right driving array test pads 32 are both two, and the two of the left driving array test pads 31 are disposed on one side of the motherboard 2, and the two of the right driving array test pads 32 are disposed on another side of the motherboard 2. Certainly, the left driving array test pads 31 and the right driving array test pads 32 may also be separately disposed on two opposite sides of each of the motherboards 2, and such equivalent replacement manner should fall within the protection scope of the disclosure.

Each of the array test pads includes 23 of the pins, a length a of each of the pins is 3.7 mm, the width b thereof is greater than or equal to 2.5 mm, a spacing c between the pins adjacent to each other is 1 mm, and a total length of the array test pad is 107.1 mm.

Compared with the related art, in the signal channel expanding system based on PAD provided by the disclosure, by using at least two left driving array test pads 31 and at least two right driving array test pads 32 on the periphery of the motherboard 2, the number of the pins 30 on the periphery of the motherboard 2 can be multiplied, the pin size remains unchanged and the test jig do not need to be lengthened.

Above are only embodiments of the disclosure is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure.

What is claimed is:

1. A signal channel expanding system based on PAD, comprising:
    a motherboard disposed on an array tester; and
    a plurality of array test pads disposed on a periphery of the motherboard and configured to control the motherboard;
    wherein each of the array test pads comprises a plurality of pins, each of the pins corresponds to a signal channel, the array test pads comprise at least two left driving array test pads and at least two right driving array test pads,
    wherein a length of each of the pins is 3.7 mm, and a width thereof is greater than or equal to 2.5 mm.

2. The signal channel expanding system based on PAD according to claim 1, wherein each of the array test pads comprises 23 of the pins.

3. The signal channel expanding system based on PAD according to claim 2, wherein a spacing between the pins adjacent to each other is 1 mm, and a total length of each of the array test pads is 107.1 mm.

4. The signal channel expanding system based on PAD according to claim 3, wherein numbers of the left driving array test pads and the right driving array test pads are the same and both are even numbers.

5. The signal channel expanding system based on PAD according to claim 4, wherein numbers of the left driving array test pads and the right driving array test pads both are two.

6. The signal channel expanding system based on PAD according to claim 5, wherein the two of the left driving array test pads are disposed on a side of the motherboard, and the two of the right driving array test pads are disposed on another side of the motherboard.

7. The signal channel expanding system based on PAD according to claim 4, wherein the left driving array test pads and the right driving array test pads are respectively disposed on two opposite sides of the motherboard.

8. The signal channel expanding system based on PAD according to claim 1, wherein a spacing between the pins adjacent to each other is 1 mm, and a total length of each of the array test pads is 107.1 mm.

9. The signal channel expanding system based on PAD according to claim 8, wherein numbers of the left driving array test pads and the right driving array test pads are the same and both are even numbers.

10. The signal channel expanding system based on PAD according to claim 9, wherein numbers of the left driving array test pads and the right driving array test pads both are two.

11. The signal channel expanding system based on PAD according to claim 10, wherein the two of the left driving array test pads are disposed on a side of the motherboard, and the two of the right driving array test pads are disposed on another side of the motherboard.

12. The signal channel expanding system based on PAD according to claim 9, wherein the left driving array test pads and the right driving array test pads are respectively disposed on two opposite sides of the motherboard.

* * * * *